United States Patent
Huignard et al.

[11] 3,936,139
[45] Feb. 3, 1976

[54] HOLOGRAPHIC MEMORY PROVIDING BOTH ANGULAR AND TRANSLATIONAL REFERENCE BEAM DEFLECTIONS

[75] Inventors: Jean Pierre Huignard; Erich Spitz, both of Paris, France

[73] Assignee: Thomson-CSF, Paris, France

[22] Filed: Sept. 7, 1973

[21] Appl. No.: 395,080

[30] Foreign Application Priority Data
Sept. 12, 1972  France .................. 72.32257

[52] U.S. Cl. .................... 350/3.5; 340/173 LM
[51] Int. Cl.² ........................... G03H 1/26
[58] Field of Search ........... 350/3.5; 340/173 LT, 173 LM; 250/550, 578

[56] References Cited
UNITED STATES PATENTS

| | | | |
|---|---|---|---|
| 3,560,071 | 2/1971 | Silverman et al. | 350/3.5 |
| 3,628,847 | 12/1971 | Bostwick | 350/3.5 |
| 3,630,594 | 12/1971 | Gorog | 350/3.5 |

OTHER PUBLICATIONS

Hill, *Applied Optics,* Vol. 11, No. 1, Jan. 1972, pp. 182-191.

*Primary Examiner*—Ronald J. Stern
*Attorney, Agent, or Firm*—Cushman, Darby & Cushman

[57] ABSTRACT

An optical system for the high density storage and retrieving of data, based upon the holographic recording technique, and incorporating two light deviating devices. The first of said devices enables the selection of an elementary area of the storage medium and the second of said device allows a plurality of superimposed holograms to be stored within said elementary area.

4 Claims, 5 Drawing Figures

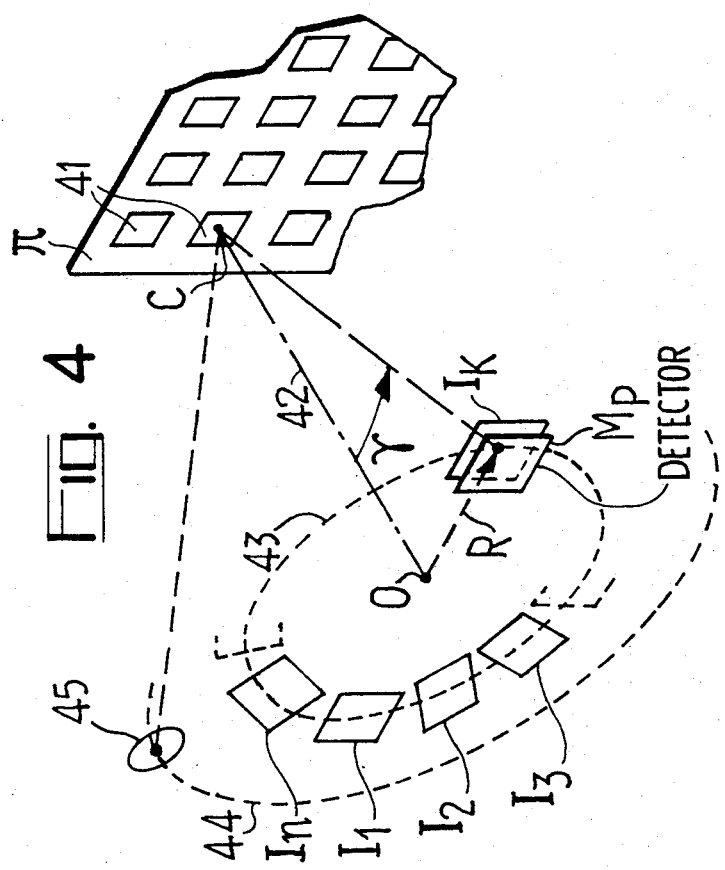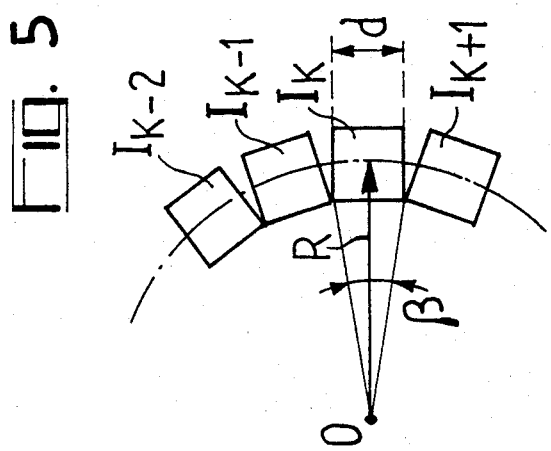

HOLOGRAPHIC MEMORY PROVIDING BOTH ANGULAR AND TRANSLATIONAL REFERENCE BEAM DEFLECTIONS

The present invention relates to an optical system for the high density storage of data, based upon holographic techniques.

Those skilled in the art will be aware that the recording of data is carried out, in this technique by illuminating a plate of photosensitive material simultaneously with two beams of coherent light, one of the beams illuminating a plane referred to as the object plane and carrying the data for recording, and the other constituting a reference beam. The photosensitive plate, once developed, constitutes a hologram which, illuminated by a read-out light beam, furnishes at least one image of the object plane; this image, projected onto the matrix of photodetectors, makes it possible to exploit the data thus recorded.

To store data in a high density fashion, it is well known to divide the area of the holographic store into a plurality of areas, called pages, each of them being constituted by the hologram of a flat and well defined modulating object, carrying the data for recording in binary form for example, and arranged in the object plane.

The organisation of this kind of data recording and read-out system, must therefore ensure that object beam and reference beam are precisely positioned on each of the pages and, moreover, in the case of the object beam, must ensure that the object plane is illuminated. It is a first object of the present invention to arrive at this result with the help of devices which, by their technological characteristics, lend themselves readily to the design of high-capacity holographic stores.

On the other hand, in order to achieve still higher capacities, it is possible to utilise a different kind of organisation, this involving the recording of several holograms on the same page. In this case, each hologram represents a determinate object whose recording is characterised by particular value of the angle of the reference beam in relation to the object beam. It is a second object of the invention to arrive at this result with the help of an auxiliary deflecting device which is integrated into the system hereinbefore referred to.

In accordance with the present invention, there is provided: a holographic data storage system for storing onto a predetermined area of a storage medium, and for retrieving from said area at least one group of data carried by a modulating object, said system comprising: a source of coherent radiation delivering a parallel beam; deflector means arranged for deflecting said parallel beam at an angle $\theta$; beam splitting means arranged for splitting said deflected beam into an object beam and at least one reference beam; first stigmatic transmission means having an optical axis, arranged for focusing said object beam onto an illumination plane and at a distance of said optical axis proportional to said angle $\theta$; stigmatic convergent means positioned for projecting onto said storage medium an image of said illumination plane; second stigmatic transmission means having a further optical axis, arranged for focusing said reference beam onto a further illumination plane, and at a further distance of said further optical axis proportional to said angle $\theta$, and holographic means arranged for projecting within said predetermined area the reference beam emerging from said second stigmatic transmission means; said modulating object being arranged across the beam transmitted by said stigmatic convergent means, and the modulated radiation emerging from said modulating object falling onto said predetermined area for forming with said projected reference beam a recordable fringe pattern representative of said group of data.

Another object of the invention is a holographic data storage system as above described, for superimposed storage of $n$ groups of data, further comprising $n$ positions beam translation means arranged for receiving said deflected beam from said deflector means; the $n$ positions produced by said beam translation means respectively corresponding to $n$ selected values of the angle of incidence of said projected reference beam onto said predetermined area; each of said selected values being associated with one of said $n$ groups of data.

For a better understanding of the invention and to show how the same may be carried into effect, reference will be made to the following description and the attached figures, among which:

FIGS. 4 and 5 are explanatory diagrams.

Figure 1:
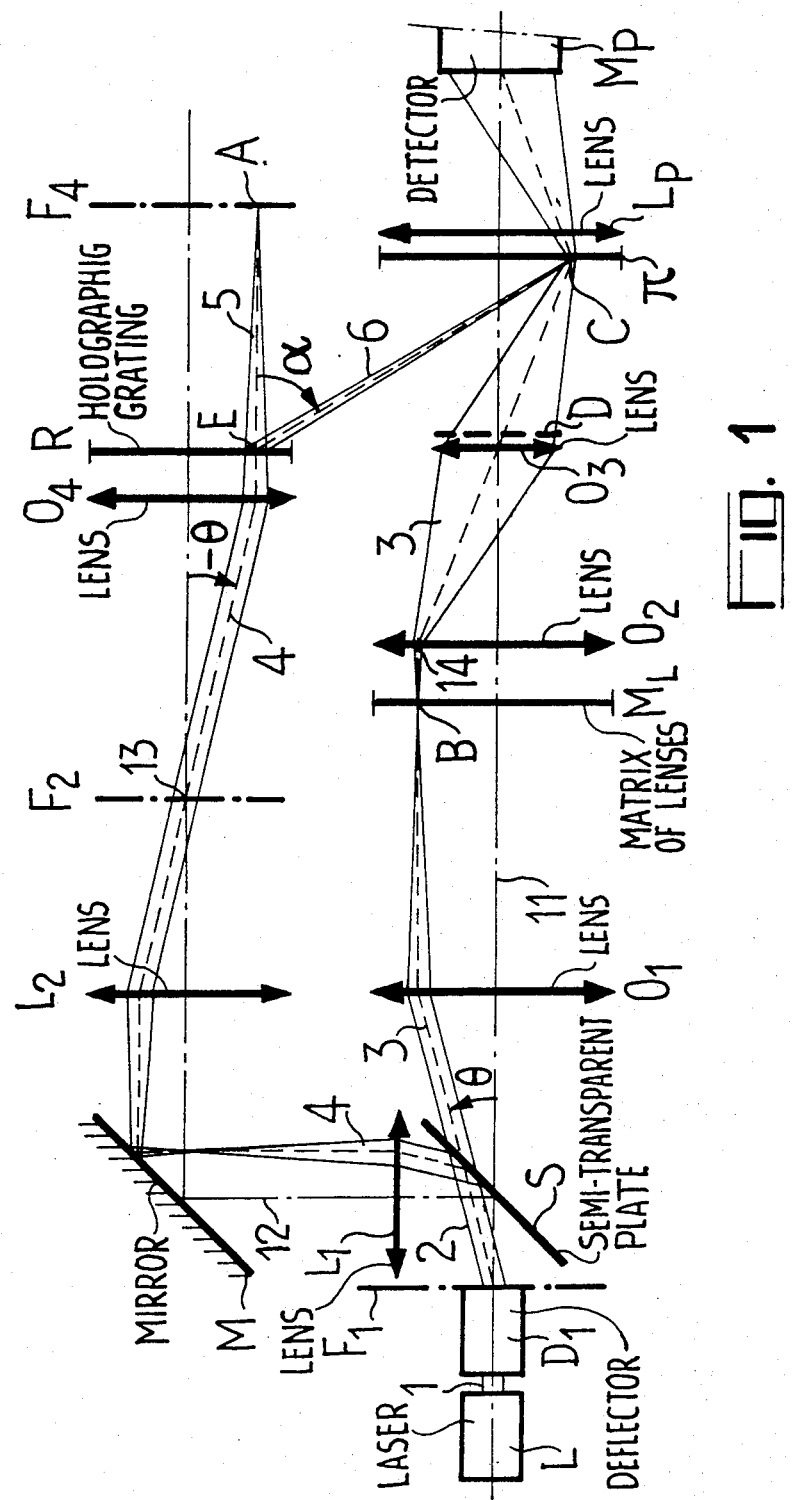
FIG. 1 illustrates an embodiment of the data storage system in accordance with the invention.

In FIG. 1, there can be seen: a source of coherent radiation L, such as a laser, producing a coherent parallel light beam 1; deflector means $D_1$ receiving the beam 1 and subjecting it to a deflection $\theta$ in relation to its incident direction 11, the emergent deflected beam being marked 2 and the exit plane of the deflector $D_1$ being marked $F_1$; beam splitting means S, separating the beam 2 into two beams 3 and 4, the first known as the object beam and the second as the reference beam, these means being for example designed in the manner shown in the figure, in the form of a semitransparent plate inclined at 45° to the direction 11 of the beam 1.

Arranged successively in the trajectory of the reference beam 4, and, by way of non-limitative example, on a common optical axis 12 symmetrical with the axis 11 considered vis-a-vis the splitting means S, there are: a first convergent lens $L_1$ whose object focal plane is symmetrical with the plane $F_1$ in relation to S; a flat mirror M inclined in relation to the optical axis 12 at an angle close to that occupied by the splitter S in relation to the axis 11; a convergent lens $L_2$ having an image focal plane $F_2$; a convergent lens $O_4$ having object and image focal planes $F_2$ and $F_4$ respectively, and holographic means R, comprising a line grating produced by the interference of two monochromatic plane waves on a photosensitive substrate. The two lenses $L_1$ and $L_2$ and the mirror M are such that in the plane $F_2$ the image (marked 13) of the aperture of the deflector $D_1$, disposed in the plane $F_1$, is produced with a magnification $-1$; the beam 4 therefore, between the lens $L_2$ and the lens $O_4$, is a parallel beam making an angle of $-\theta$ with the optical axis 12.

The devices $L_1$, M, $L_2$ and $O_4$ together constitute second stigmatic transmission means having an optical axis (12).

In the absence of the holographic grating R, the reference beam converges geometrically and in accordance with a trajectory marked 5 in the figure, at a point A in the illumination plane $F_4$, this point being determined by the deflection angle $\theta$. The interposition of the grating R causes the incident beam 4 to be deflected towards a point C along a trajectory marked 6 in the figure; the position of the point C is determined by the formulae linking the holograms and the deflection angle of the grating R. In other words, if we call $\alpha$ the angle between the paths 5 and 6, B the point of intersection between the plane of the grating R and the axis of the incident beam, $\lambda$ the optical wavelength of the reference beam, $\lambda_o$ the optical wavelength of the beams utilised for recording the hologram R, and the diffraction angle of the grating R for an incident beam of wavelength $\lambda$, then we have:

$$EC = EA.\cos^2 \alpha \text{ and } \sin \alpha = \frac{\lambda}{\lambda_0}.\sin \alpha_0;$$

it is thus possible to select the position of a plane containing the point C.

In the trajectory of the object beam 3, there are, successively arranged: first stigmatic transmission means for focusing the object beam onto an illumination plane, these means in the embodiment shown being made of a convergent lens $O_1$ of focal length F equal to that of the lens $O_4$; a matrix $M_L$ of convergent lenses having the same focal length f and being arranged in the same plane; a convergent lens $O_2$; stigmatic convergent means $O_3$, such as a lens; a flat modulating object D; and the plane $\pi$. These various means are arranged in such a fashion that the plane $F_1$ and the object focal plane of the lens $O_1$, are coincidental, and that the matrix of lenses $M_L$ is located in the focal plane of the lens $O_1$; i.e. said illumination plane and also that lens $O_2$ is located at a distance $f$ from the matrix $M_L$. The modulating object D containing the data for recording in a store page arranged in the plane $\pi$, is placed against the lens $O_3$ which is operated at a magnification of $-1$. All these elements, by way of non-limitative example, have the same optical axis 11, namely that of the beam 1.

The beam 3 therefore converges geometrically at a point B in the illumination plane, determined by the value of the deflection angle $\theta$; this convergence point is as a matter of fact, the centre of a spot due to diffraction phenomena, as explained hereinafter. The deflector $D_1$ is being designed to address each of the pages of the plane $\pi$, and the values of $\theta$ are thus predetermined so that each of them correspond with a determinate point of geometric convergence, such as B, which is chosen as the optical centre of one of the lenses making up the matrix $M_L$. The direction of the beam 3 (parallel to the axis 11) thus remains the same up to the lens $O_2$, and the beam forms on the objective lens $O_2$ a spot 14 whose dimensions are determined by the diffraction phenomena and the focal length f of the lenses of the matrix $M_L$, in order to ensure that the beam has an adequate aperture for it to illuminate the whole of the object D. In the figure, the true scale of the system is not respected, and it is such that the beam 3 is very slightly convergent at B; by way of example, the system has been designed with focal lengths F and $f$ respectively of 120 cm and 1.3 cm.

The lens $O_2$ is designed to ensure that the object beam 3 illuminates the object D, whatever the position of the point B; the lens $O_3$ is designed to ensure geometric convergence of the beam 3 in the store plane $\pi$, in a zone centred at C; the position of the point C is a function of that of the point B and therefore of the angle $\theta$. Thus, the zone of the plane $\pi$ is addressed by the deflector $D_1$.

As a matter of fact, the zones of convergence referred to hereinbefore and illustrated in the figure by the geometric points A and B, have a size which is determined by diffraction phenomena; at B, the diffraction pattern obtained is the Fourier transform of the distribution of complex amplitudes of the wave surface emerging from the lens $O_1$. This diffraction pattern is a figure of revolution and is constituted, as those skilled in the art will be aware, by a brilliant central spot whose diameter is in particular a function of the focal length of the lens for a given wavelength of the light beam, this spot being surrounded by rings whose intensity decreases very rapidly with increasing distance from the geometric centre B of the diffraction pattern. At A, the diffraction pattern obtained is identical to the latter, the parameters (wavelength of the radiated energy, width of the beam and focal length of the objective length) being equal. By way of example, if object beam 3 and reference beam 4 are of gaussian kind and around 1 mm in diameter, the lenses $O_1$ and $O_4$, having focal lengths of around 2 metres, it is possible to illuminate in the plane $\pi$ a circular page 1 mm in diameter.

The operation of the recording system is as follows: a flat object carrying the data for recording in a given storage page, is arranged in the plane D and a plate of photosensitive material is arranged in the plane $\pi$. The deflector $D_1$ imparts to the light beam 1 a deflection angle $\theta$ corresponding to the page in question, and this latter is illuminated simultaneously by the reference beam 4 and the object beam 3, in accordance with the processes hereinbefore described, thus enabling holographic recording of the data carried by D, in that page of the plane $\pi$ which is centred at the point C.

The operation of the system at read-out of the data contained in a hologram arranged in the plane $\pi$, simply utilises the reference beam 4 and 6. To this end, a shutter device is required, not shown in the figure, arranged in the path of the beam 3 and blocking the latter in this situation; it can be constituted, for example, by means of an electro-optical device arranged in the path of the beam 4 after the splitter or by replacing the semi-transparent plate (S) by a totally reflecting mirror. It also requires a projection lens $L_p$ and a detector $M_p$ such as matrix of photodetectors, arranged at the location where the real image of the modulating object (D) recorded in the page of the plane $\pi$, is formed, thus reconstituting in the form for example of electrical signals, the data contained in the plane B. In this embodiment, where the read out beam is identical with the reference beam, the illumination of the hologram in particular furnishes an image, conventionally called a direct image, at the location of the object D; in order to project it onto the matrix $M_p$, the latter is disposed symmetrically to the plane D in relation to the hologram and the lens $L_p$ is arranged against the plane $\pi$.

Figure 2:
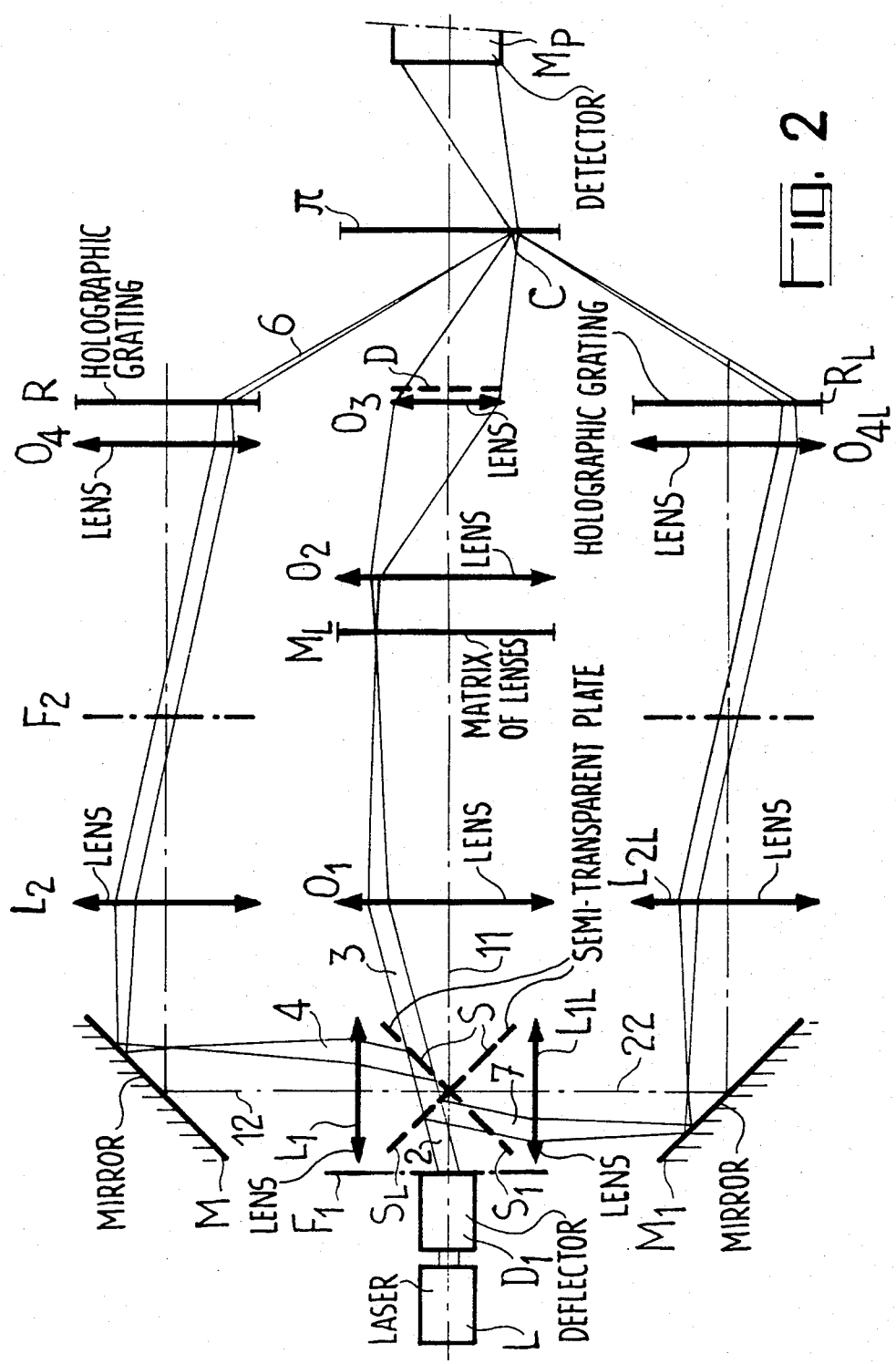
FIG. 2 illustrates a variant embodiment of the system shown in FIG. 1.

FIG. 2 illustrates a variant embodiment of the system shown in FIG. 1, in which variant embodiment the read-out of the data recorded in the hologram $\pi$ is performed not by the reference beam 4 utilised at the time of recording, but by a further beam symmetrical therewith in relation to the object beam.

Thus, in this figure the same elements as in the preceding figure have been shown, namely the laser L, the deflector $D_1$, the beam splitting means S which produces from the deflected beam 2 the object beam 3 and the reference beam 4 converging at a page centred at C in the plane $\pi$, this after having passed through the various elements hereinbefore described, and the detector $M_p$. Also shown are: a second position $S_L$ of the semi-transparent plate S, making an angle of 90° with the position which it occupied in the foregoing diagram (marked $S_1$ in this figure,) a convergent lens $L_{1L}$, a flat mirror $M_1$, a convergent lens $L_{2L}$, a convergent lens $O_{4L}$ and a holographic grating $R_L$; these various elements all have the same optical axis 22, symmetrical with the axis 12 in relation to the axis 11, and are identical to the elements $L_1$, M, $L_2$, $O_4$ and R respectively.

The semi-transparent plate S, in its positions $S_L$, makes it possible to produce the further beam 7 which then converges on the page centred at C, by the same mechanism as that already described in respect of the reference beam 4.

Another method of obtaining the read-out beam 7, not shown, is to insert an electro-optical double-refracting switch between the deflector $D_1$ and the beam splitting means S. It will be remembered that a switch of this kind is conventionally constituted by three elements:

an electro-optical element such as a KDP crystal, controlled by a voltage with the result that the polarization of the incident beam 2 is or is not, as the case may be, rotated through 90° according to the value of the voltage applied;

a double-refracting crystal transmitting (ordinary ray) the beam 2 towards the spliting means S if its polarization has not been modified by the preceding element, and deflecting that beam through 90°, along the path 7, if its polarization has been rotated;

an electro-optical element arranged in the path of the extraordinary ray, which makes it possible to restore to its initial orientation the polarization of the beam 7.

Utilising the system shown in FIG. 2, the recording of the data is carried out with the help of the beams 3 and 4 as before. Read-out is effected with the aid of the beam 7 alone. The illumination of a page of the plane $\pi$ under these circumstances, in particular furnishes an image, conventionally referred to as the conjugate of the direct image, which it forms symmetrically to the object D in relation to the plane $\pi$, that is to say on the detector $M_p$.

This embodiment makes it possible to avoid the use of a projection lens such as that $L_p$ (FIG. 1) the design of which becomes problematical in the case of high-capacity systems where the storage plane $\pi$ is of large size. More generally, the organisation of the system in accordance with the invention, in either of the embodiments hereinbefore described, is particularly well suited to the recording of data in high density fashion, thanks to the use of elements such as the matrix lenses $M_L$ or the holographic grating R which can readily be produced even if the dimensions of the storage plane become large.

Figure 3:
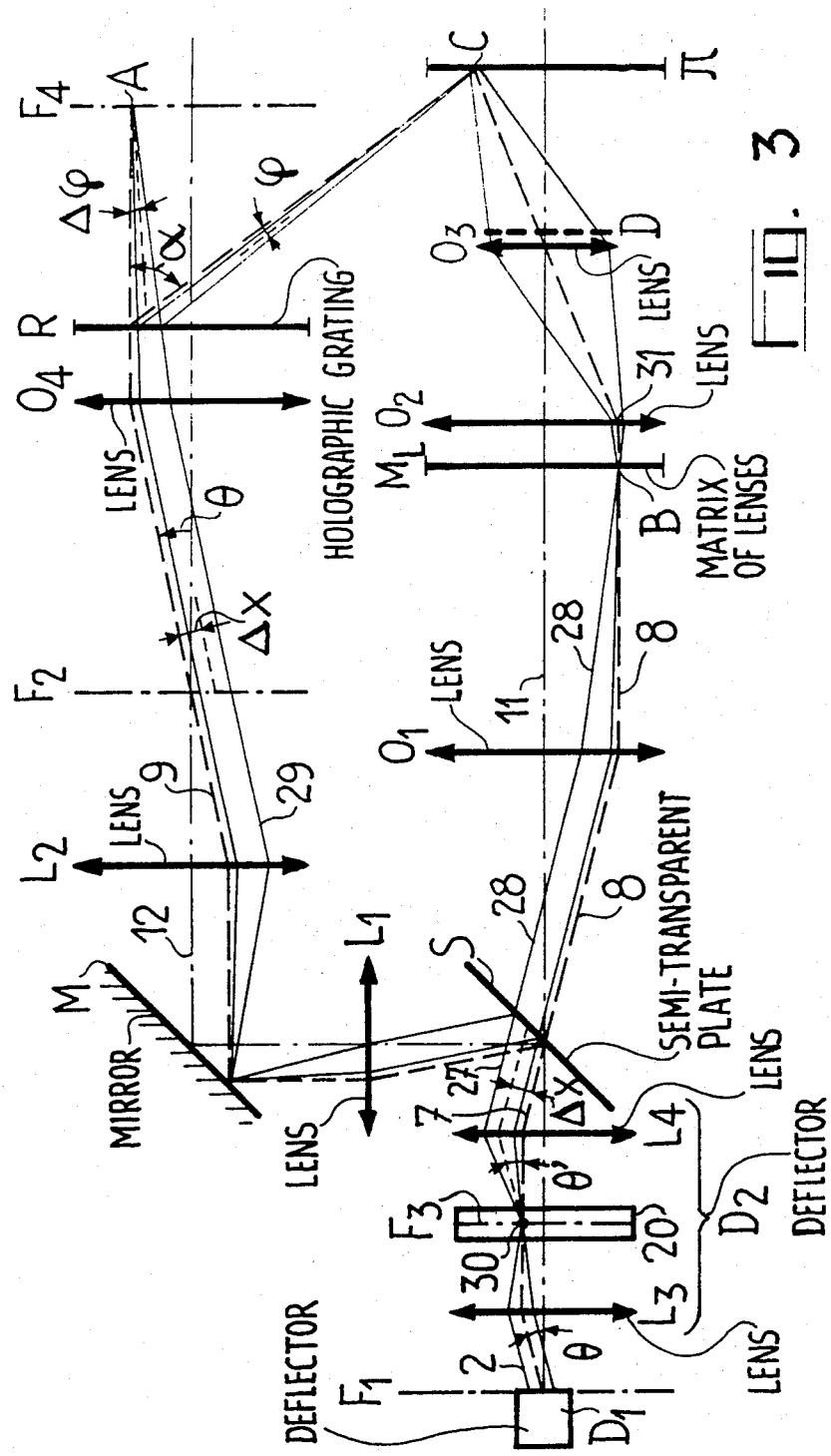
FIG. 3 illustrates another embodiment of the system in accordance with the invention, which includes the auxiliary deflection device referred to hereinbefore.

FIG. 3 illustrates another embodiment of the system in accordance with the invention, in which the superimposition of holograms in the same storage area is utilised.

In this figure, there can be seen all the devices shown in FIG. 1, except L, $M_p$ and $L_p$, namely: the deflector $D_1$, producing the deflected parallel beam 2, making an angle $\theta$ with the axis 11; the beam splitting means S; the lens $O_1$, the matrix of lenses $M_L$, the lens $O_2$, the lens $O_3$ and the modulating object D in the trajectory of the object beam; the lens $L_1$, the flat mirror M, the lens $L_2$ having the image focal plane $F_2$, the lens $O_4$ having the image focal plane $F_4$ and the holographic grating R in the trajectory of the reference beam; and, finally, the storage plane $\pi$. The system furthermore comprises beam translation means marked $D_2$ and also called deflector hereinafter, arranged between the deflector $D_1$ and the splitter S. The beam 2 emerging from the deflector $D_1$ is marked 27 after it has passed through the deflector $D_2$; it is split by the means S into an object beam 28 and a reference beam 29, these two beams converging on a page centred at C in the plane $\pi$, by the same mechanisms as are employed in respect of the beams 3 and 4 of FIG. 1.

The purpose of the beam translation means $D_2$ is on the one hand to produce a beam (27) whose direction makes with the axis 11 an angle defined by the deflector $D_1$ (an angle equal to $-\theta$ for example as shown in the figure), and on the other hand to control the displacement of the beam 27, parallel to itself, by a predetermined quantity $\Delta X$ in relation to an axis 7.

An embodiment of a device of this kind is that illustrated in the figure and described in the United States pat. application Ser. No. 364,758, now Pat. No. 3,874,785. At this point, a brief recapitulation of its design and operation will be made: it is constituted by three elements, namely a convergent lens $L_3$, an acousto-optical deflector element 20 and a convergent lens $L_4$; these elements are arranged in such a fashion that the plane of symmetry $F_3$ of the element 20 constitutes the image focal plane and the object focal plane of the lenses $L_3$ and $L_4$ respectively, the object focal plane of the first ($L_3$) being constituted by the plane $F_1$ and the image focal plane of the second being coincidental with the object focal plane of the lens $O_1$.

This device operates in the following manner: the lens $L_3$ produces geometric convergence of the beam 2 at a secondary focus 30. The acousto-optical element 20 is constituted by a liquid or a solid such as lead molybdate, in which ultrasonic waves of wavelength $\lambda_g$ are generated by means of a generator connected to the element 20 through the medium of a transducer, these two devices not having been shown in the figure. The ultrasonic waves have the effect of creating an index grating whose plane wavefronts are at pitch intervals of $p = \lambda_G$, and which produces diffraction of the incident beam in a direction making an angle $\theta'$ with the axis of the incident beam, this angle $\theta'$ of deflection being in particular a function of $\lambda_G$. In this case, the various possible values of angle $\theta'$ are located in the same plane, perpendicular to said wavefronts, deflection in space is produced by the help of means described in the aforementioned patent application, namely, for example, a second generator, associated with a second transducer, creating wavefronts perpendicular to the former ones.

After having passed the lens $L_4$, the beam 27 makes a constant angle of $-\theta$ with the axis 11; the deflection $\theta'$ is therefore translated, as far as the emergent beam (27) is concerned, into a translation by $\Delta X$ in relation to a reference axis 7, chosen for example as the optical axis of a beam undiffracted by the element 20.

The means S split the beam 27 into an object beam 28 and a reference beam 29. Also shown are the optical axes 8 and 9 of the object beam and the reference beam, corresponding to the beam of axis 7 hereinbefore defined.

The object beam 28 of lenses $M_L$, and the angle at which the object beam illuminates a page in the plane $\pi$ is not practically dependent of the value of the angle of deflection $\theta'$ due to element 20.

The reference beam 29 is characterised, in the plane $F_2$, by a translation of $\Delta X$ in relation to the axis 9, this axis passing through the image focus of the lens $L_2$ and making an angle $\theta$ with the axis 12. The beam 29 and the axis 9 converge at a point (1) in the illumination plane $F_4$, in the absence of the grating R, at an angle marked $\Delta\phi$, in relation to the axis 9, the magnitude of which angle is proportional to $\Delta X$. In the presence of the grating R, the beam 29 is diffracted towards the point C at an angle $\phi$ in relation to the axis 9; this angle $\phi$ is a function on the one hand, of course, of the focal lengths chosen for the different lenses, and on the other hand of the angle of deflection $\theta'$ due to the device $D_2$: in other words, in particular with the help of the hologram combination formulae, it is shown that $\phi = \Delta\phi \cos \alpha$, that is to say that $\phi$ is a function of $\Delta X$, and consequently of $\theta'$.

This device thus makes it possible to illuminate a page in the plane $\pi$ using two coherent light beams and modifying the angle between one of these beams and the storage plane, with the help of the deflector $D_2$. It is thus possible to carry out the recording of a plurality of $n$ elementary holograms on the same page of the plane $\pi$, each corresponding to a different group of data carried by a modulating object (arranged in the plane D), and being characterised by a particular value of the angle $\phi$, and consequently of the angle $\theta'$ and the wavelength $\lambda_G$.

In addition, the insertion of the means $D_2$ into the system, prior to the splitter S, introduces pivoting of the object beam 28 at the point B, so that conditions are imposed upon the focal length f of the lenses of the matrix $M_1$: $f$ must not be too large in order that the point 31 constituted in section between the axis of the beam 28 and the lens $O_2$, shall not be substantially displaced, and in order that the modulating object D shall always be properly illuminated.

In order to obtain a discrete sequence of n values of angle $\phi$, it has been described an acousto-optical device ($D_2$) the position of which is given by the necessity for the object and reference beams to have the same wavelenght. Another embodiment of the beam translation means $D_2$ can be a mechanical one but, then, the time of access to the plane is substantially increased. A further embodiment of these means is an electro-optical device, such as N stages of electrically controled double-refractive crystals, positioned between lens $L_2$ and $O_4$, thus avoiding the abovementioned imprecisions near matrix $M_L$ and enabling $n = 2^N$ positions for the beam 29.

The light beam utilised for selective read-out of one of the elementary holograms recorded in a page of the plane $\pi$, is identical with the reference beam 29, making it possible to precisely reproduces the recording conditions, characterised by the value of the angle $\phi$, the accuracy of reproduction being a necessary condition of read-out.

As shown in FIG. 2 for the embodiment of FIG. 1, it is possible to realize the read-out of an elementary hologram with a beam roughly symmetrical to beam 29, in relation to axis II.

In conclusion, to record or read-out a hologram arranged in the plane $\pi$, two deflection operations are therefore required: a first, using the deflector $D_1$, to choose that of the values of the angle $\theta$ which corresponds to the page in question in the plane $\pi$, and a second, utilising translation of the reference beam, to choose that of the values of the angle $\phi$ which corresponds to the appropriate elementary hologram.

The storage medium best suited to this kind of system is a so-called thick material, that is to say one whose thickness is very much in excess of the wavelength of the beam radiant energy, such as a photopolymer or a photoferroelectric material. However, it is equally possible to carry out superimposition of holograms on socalled thin material, that is to say one whose thickness is in the same order of magnitude as the wavelength of the beam radiant energy;

FIG. 4 illustrates in this context how the images of the elementary holograms recorded on the same page are formed, when said page is illuminated by a read-out beam.

In this figure there have been shown: the plane $\pi$ where the holographic store to be read-out, is located; the pages 41 of said store; the normal 42 to the plane $\pi$; the detector $M_p$ arranged as described hereinbefore; a circle 43 of radius R and centre O, located in the plane of the detector $M_p$ and passing through its centre and those of the images $I_1 \ldots I_k \ldots I_n$ hereinafter defined; and a circle 44 likewise situated in the plane of the detector $M_p$ and carrying the trace 45 of the read-out beam in said plane.

When the read-out beam illuminates a page 41 in the plane $\pi$, at an angle of incidence identical (or symmetrical in the case of the read-out operation described in FIG. 2) to that of the reference beam at the time of recording the $k^{th}$ elementary hologram on this page, the n images ($I_1 \ldots I_n$) corresponding to the n elementary holograms, are formed in the plane carrying the detector $M_p$, the image $I_k$ corresponding to the $k^{th}$ hologram forming under excellent conditions of optical reconstitution, on the detector $M_p$ itself, in the manner hereinbefore described.

In order for it to be possible to utilise a detector $M_p$ without deplacing it, to read-out the $n$ elementary holograms, it is necessary for the images I to form upon a circle (43) and this imposes a condition upon the choice of the deflection angle $\theta'$: at recording, the envelope of the reference beam positions should in effect be a cone centred at C and of circular section.

In addition, the number $n$ of recordings on the same page 41 is limited by the possible superimposition of two consecutive images I. The limiting case is represented in FIG. 5: four images $I_{k-2}$, $I_{k-1}$, $I_k$ and $I_{k+1}$ adjacent to one another of the circle centred at O and of radius R, each of these images being a square of side length $d$, viewed from the point 0 at an angle $\beta$. The maximum number $n$, notated $n_m$, can be determined in the following manner:

$$n_m = \frac{2\pi}{\beta}, \text{ where } n_m = \frac{\pi}{\text{Arc } tg \frac{d}{2(R-d/2)}}$$

knowing that the detector $M_p$ is symmetrical with the plane D (and with the lens $O_3$) and that the parameters d and OC (FIG. 4) are not independent, but that their ratio $d/OC = k$ constitutes the aperture of the lens $O_3$, we can write:

$$n_m = \frac{\pi}{\text{arc } tg \frac{k}{2 \, tg \, \gamma - k}}$$

this defining a limiting value of the angle ($\gamma$) of the object beam in relation to the normal to the plane $\pi$, in the case where the hologram is recorded on a thin material. In the case of thick holograms, this kind of limiting value is not introduced because of the fact that when the read-out beam is in the same position as the reference beam at the time of recording the $k^{th}$ elementary hologram, as those skilled in the art will appreciate, only the corresponding image $I_k$ is in fact reconstituted.

What we claim is:

1. A holographic data storage system for storing onto a predetermined area of a storage medium, and for retrieving from said area at least one group of data carried by a modulating object, said system comprising: a source of coherent radiation delivering a parallel beam; deflector means arranged for deflecting said parallel beam at an angle $\theta$; beam translation means, arranged for receiving said deflected beam from said deflector means and for selectively laterally translating the angularly deflected beam to one of a plurality of laterally displaced positions while preserving the direction of propagation of the translated beam along the $\theta$ direction beam splitting means arranged for splitting said translated beam into an object beam and at least one reference beam; first stigmatic transmission means having an optical axis, arranged for focusing said object beam onto an illumination plane and at a lateral distance from said optical axis proportional to said angle $\theta$; stigmatic convergent means positioned for projecting onto said storage medium an image of said illumination plane; second stigmatic transmission means having a further optical axis, arranged for focusing said reference beam onto a further illumination plane with an angle of incidence which is dependent upon said laterally displaced position, and at a further lateral distance from said further object axis proportional to said angle $\theta$, and holographic means arranged for projecting within said predetermined area the reference beam emerging from said second stigmatic transmission means; said modulating object being disposed in the beam transmitted by said stigmatic convergent means, and the modulated radiation emerging from said modulating object falling onto said predetermined area for forming with said projected reference beam a recordable fringe pattern representative of said group of data.

2. A holographic data storage system as claimed in claim 1, wherein said beam translation means comprise: a first lens positioned for focusing said deflected beam onto a focal plane, an acousto-optical deflector element for imparting $n$ distinct orientations to the focused radiation emerging from said focal plane, said focal plane being within said acousto-optical element, and a second lens positioned for receiving the radiated energy emerging from said acousto-optical deflector element; said second lens forming with said lens an afocal optical combination.

3. A holographic data storage system as claimed in claim 1, further comprising a matrix of lenses positioned at said illumination plane, said lenses having the same focal length; the portion of said object beam emerging from said first stigmatic transmission means being focused near the optical center of one of said lenses.

4. A holographic data storage system as claimed in claim 3, further comprising a lens arranged between said matrix and said modulating object, at the image focal plane of the lenses of said matrix.

* * * * *